United States Patent
Schmitt et al.

[11] Patent Number: 6,099,649
[45] Date of Patent: Aug. 8, 2000

[54] CHEMICAL VAPOR DEPOSITION HOT-TRAP FOR UNREACTED PRECURSOR CONVERSION AND EFFLUENT REMOVAL

[75] Inventors: John Vincent Schmitt; Ling Chen, both of Sunnyvale; George Michael Bleyle, Fremont; Yu Cong, Sunnyvale; Alfred Mak, Union City; Mei Chang, Saratoga, all of Calif.

[73] Assignee: Applied Materials, Inc., Santa Clara, Calif.

[21] Appl. No.: 08/996,735

[22] Filed: Dec. 23, 1997

[51] Int. Cl.⁷ .................................................. C23C 16/00
[52] U.S. Cl. ...................... 118/715; 118/726; 55/342.1; 55/342.2; 55/465; 422/168; 422/169; 422/173; 422/176
[58] Field of Search .................................. 118/715, 726; 55/342.1, 342.2, 465; 422/168, 169, 173, 176

[56] References Cited

U.S. PATENT DOCUMENTS

| | | | |
|---|---|---|---|
| 3,618,314 | 11/1971 | Krebs | 422/169 |
| 5,114,683 | 5/1992 | Hirase | 422/173 |
| 5,123,375 | 6/1992 | Hansen | 118/715 |
| 5,405,445 | 4/1995 | Kumada et al. | 422/168 |
| 5,422,081 | 6/1995 | Miyagi et al. | 422/168 |
| 5,458,862 | 10/1995 | Glawion | 422/169 |
| 5,536,321 | 7/1996 | Olsen et al. | 118/726 |
| 5,556,473 | 9/1996 | Olson et al. | 118/715 |
| 5,819,683 | 10/1998 | Ikeda et al. | 422/168 |

FOREIGN PATENT DOCUMENTS

| | | | |
|---|---|---|---|
| 0 811 413 A2 | 12/1997 | European Pat. Off. | B01D 53/00 |
| 0 823 279 | 2/1998 | European Pat. Off. | B01D 53/46 |
| 59-223294 | 12/1984 | Japan | C30B 25/02 |

OTHER PUBLICATIONS

Lewis, Richard, Hawley's Condensed Chemical Dictionary, 12th Ed., pp. 309–310, 1993.

Primary Examiner—Stanley S. Silverman
Assistant Examiner—Michael P. Colaianni
Attorney, Agent, or Firm—Townsend and Towsend & Crew

[57] ABSTRACT

A hot trap converts unreacted organic metal-film precursor from the exhaust stream of a CVD process. The converted precursor forms a metal film on the surface of the hot trap, thereby protecting hot vacuum pump surfaces from metal build up. A cold trap downstream from the hot trap freezes effluents from the exhaust stream. The metal captured by the hot trap and the effluents captured by the cold trap may then be recycled, rather than being released as environmental emissions.

18 Claims, 4 Drawing Sheets

CHEMICAL VAPOR DEPOSITION HOT-TRAP FOR UNREACTED PRECURSOR CONVERSION AND EFFLUENT REMOVAL

BACKGROUND OF THE INVENTION

The present invention relates to semiconductor processing equipment and more specifically to a method and apparatus for abatement and optional recovery of by-products from the chemical vapor deposition (CVD) of metal layers, particularly copper layers.

During a typical CVD process, deposition gas or gases inside a processing chamber form a thin film layer on the surface of a substrate being processed. Some CVD processes react two gases together to form the desired layer, such as reacting oxygen with silane to form a layer of silicon oxide. Other CVD processes use a single reactive gas that decomposes to form the desired layer and, typically, byproducts. In addition to the byproducts of the layer-forming reaction, there may be unreacted deposition gas, also known as precursor gas, within the CVD system. Some precursor gases react on surfaces of the CVD system and build up deposits, or decompose to form particles. Similarly, the byproducts of a deposition reaction can build up or form particles. Typically, the CVD system will need to be cleaned at some point, depending on the type and number of deposition processes. This cleaning removes the CVD system from the production stream, and can be very expensive in terms of lost production output.

The semiconductor market is very competitive and semiconductor products have constantly evolved over the last several decades, resulting in smaller and faster microcircuits. Many of the advances in semiconductor processing have focused on making structures, such as metallization lines, on the microcircuits smaller, so that individual devices could be packed closer together, allowing more devices to be fabricated on a single chip.

The most common material for use as a conductor in semiconductor fabrication processes has been aluminum or aluminum alloys. Aluminum is relatively easy to apply, typically by sputtering, and is compatible with both silicon and silicon dioxide. However, as device geometries have gotten smaller, the conductive aluminum traces used on those devices have also gotten smaller. Characteristics of aluminum that did not create significant problems in larger device geometries have become more of a problem as geometries shrank. Specifically, although aluminum is a relatively good conductor, the resistance of very fine aluminum traces can slow down the operation of integrated circuits.

Copper, which has lower resistivity than aluminum, is an alternative metal for use in integrated circuits that has become more economically attractive as devices have become smaller and faster. As with any new technology, unforseen problems arise when the technology is applied to specific products. With copper, new ways of depositing the metal films needed to be developed that would work with existing and planned device geometries. One method that has been developed for depositing a copper film on a substrate uses an organic copper precursor that, under suitable conditions, breaks down to leave a copper film on the substrate. Typically, some of the copper precursor does not react on the substrate, and might react on other parts of the CVD system the substrate is processed in, such as the vacuum pump that is used to exhaust the process chamber. Vacuum pumps produce heat, and the heated pump can cause the unused copper precursor to react on pump surfaces, degrading the pumping efficiency and reliability. Furthermore, the copper-forming reaction of the precursor produces byproducts that may be harmful to personnel or the environment.

Therefore, it is desirable to provide a way of keeping the copper precursor from forming copper on the pump surfaces, and keeping byproducts of the reaction safely contained so that they do not pose a risk to personnel or the environment.

SUMMARY OF THE INVENTION

The present invention provides a method and apparatus for removing metal from an exhaust stream of a CVD process. Unreacted metal-film precursor in the exhaust stream is converted on a heated surface of a hot trap to form a volatile metal-organic compound and a metal layer on the surface of the hot trap, thus removing metal from the exhaust stream. In a further embodiment, a metal-organic compound is removed from the exhaust stream by freezing the compound on the walls of a cold trap. The metal recovered in the hot trap and the metal-organic compound recovered in the cold trap may both be recycled, thus reducing the net emissions from the CVD process. The hot trap also protects downstream components, such as a foreline or vacuum pump, from being coated with a metal film or layer of condensed precursor.

These and other embodiments of the present invention, as well as some of its advantages and features are described in more detail in conjunction with the text below and attached figures.

DESCRIPTION OF PREFERRED EMBODIMENTS

Figure 1:
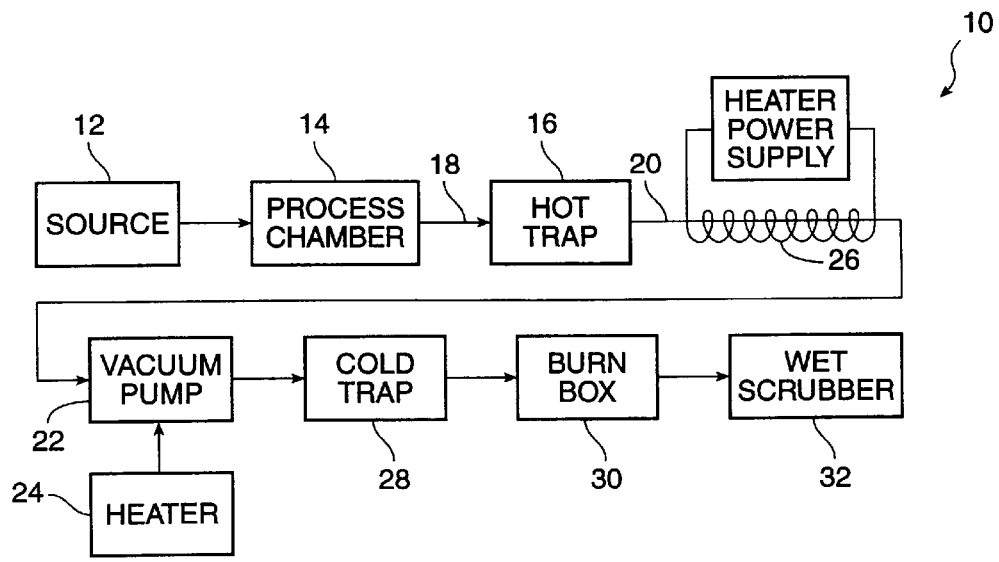
FIG. 1 is a simplified block diagram of a CVD and abatement system according to one embodiment of the present invention.

A process has been developed to form a film of copper on a substrate using a metal-organic precursor. In a typical process, the liquid precursor is vaporized into a stream of carrier gas, which is typically not reactive, and flown into a CVD reaction chamber that is maintained at a reduced pressure, typically between 0.5–2 Torr. A process substrate, or wafer, within the chamber is heated to around 200° C. The precursor decomposes on the surface of the wafer to form a film of copper and byproducts. The carrier gas, unused precursor, and volatile byproducts are pumped out the exhaust port of the chamber. Suitable precursors include CUPRASELECT®, manufactured by SCHUMACHER of Carlsbad, Calif., and MHY COPPER™, manufactured by ATMI of Danbury, Conn. The example given below is for CUPRASELECT®, but the technique may apply to other precursors, including precursors for metal deposition chemistries other than copper.

CUPRASELECT® is ((Trimethylvinylsilyl) hexafluoroacetylacetonato Copper 1, Trimethylvinylsilane, 1,1,1,5,5,5-Hexafluoro-2,2,4,4-tetrahydroxypentane), also known as "$Cu^+$(TMVS)(hfac)". For use in some CVD processes, CUPRASELECT® is blended with additional Trimethylvinylsilane ("TMVS") and additional 1,1,1,5,5,5-Hexafluoro-2,2,4,4-tetrahydroxypentane ("hfac") that is a hexafluoro-organic compound. CUPRASELECT® reacts to form copper according to the following equation:

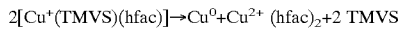

The above equation shows that two byproducts are produced by the reaction of CUPRASELECT® on a substrate. TMVS remains as a volatile vapor that is relatively easy to burn off after the vacuum pump exhaust using standard methods. The $Cu^{2+}$ (hfac)$_2$ however, freezes into a solid at about 80° C., which is well above typical ambient temperatures of around 20–25° C. Furthermore, a significant portion of the CUPRASELECT® does not react on the surface of the wafer in a typical deposition process. In fact, some systems show that up to 85% of the copper contained in the precursor flowing into the chamber goes out the exhaust port of the chamber. As shown in the above equation, the decomposition reaction has a maximum efficiency of 50%, as half the copper in the precursor converts to $Cu^{2+}$ (hfac)$_2$, which is carried off in the exhaust stream. This means that if 85% of the copper entering the deposition chamber is carried off, only about 15% has been converted into metallic copper inside the chamber. This also means that about 15% of the copper in the exhaust stream is in the form of $Cu^{2+}$(hfac)$_2$ as a byproduct of the chamber reaction, and the remaining 70% of the copper that originally flowed into the chamber may be in the form of unconverted precursor, and capable of reacting to form copper films.

The unreacted precursor may break down and form a copper layer on surfaces as warm as 60° C. Mechanical vacuum pumps used with CVD systems, such as the QDP80™, manufactured by EDWARDS CORPORATION, may run as hot as 105° C. and break down the unreacted precursor. This causes a layer of copper to form on the inner surfaces of the pump. As the copper builds up, the pump loses pumping efficiency, which affects pumping capacity, and the pump will fail as the copper build-up changes the mechanical tolerances of the working surfaces of the pump. Vacuum pumps have failed after 1000 gms of precursor have been used in the deposition chamber. This amount of precursor consumption represents about 3 days of production wafer fabrication at anticipated manufacturing levels. However, it is unlikely that a hot vacuum pump would convert all of the unreacted precursor, resulting in a high concentration of copper in the effluent from the pump. This copper effluent is often subject to regulations that seek to reduce the release of copper into the environment.

Much of the work being done on copper CVD has been done in a research and development ("R&D") environment, rather than a production environment. Whereas an R&D CVD system may process only a few dozen wafers over a period of weeks, a production CVD system may process hundreds of wafers a day. A pump failure due to copper build up may take months to occur in an R&D system, but only days to occur in a production assembly line. Without an appropriate solution, copper build up in the pump may preclude this type of copper CVD system from being commercially practical because of the maintenance costs and lost production time.

Another problem becomes significant when copper CVD is performed in production volumes. That problem is the accumulation of $Cu^{2+}$(hfac)$_2$, which freezes at about 80° C. The deposition process is performed at an elevated temperature, keeping this compound in the vapor phase, but if the vapor contacts a cold surface, for example in the exhaust line, it will condense on the walls of the exhaust line. The accumulation of $Cu^{2+}$(hfac)$_2$ on the walls of the exhaust line create at least three problems. First, the accumulation will eventually constrict the exhaust line, resulting in increased flow resistivity and reduced pumping efficiency and capacity. Second, the condensed $Cu^{2+}$ (hfac)$_2$ is a particle source that may allow particles to backstream into the chamber during wafer processing, causing particle-related defects on the wafers. Third, the $Cu^{2+}$ (hfac)$_2$ contains fluorine, and is an acutely reactive, extremely hazardous product that could injure workers or contaminate the environment if the exhaust line becomes exposed to the atmosphere.

FIG. 1 is a simplified diagram of a CVD system 10 for use with an organo-metallic CVD process. A source 12 provides precursor to a processing chamber 14. A hot trap 16 is situated adjacent to the chamber to convert unreacted precursor into copper, $Cu^{2+}$(hfac)$_2$ and TMVS. The hot trap is close enough to the chamber so that process heat from the chamber keeps the $Cu^{2+}$(hfac)$_2$ from freezing on the conduit 18. A heated foreline 20 between the hot trap 16 and a vacuum pump 22 keeps the $Cu^{2+}$ (hfac)$_2$ from freezing on the walls of the foreline.

The pump 22 is also heated to a temperature sufficient to keep the $Cu^{2+}$ (hfac)$_2$ from freezing, and any residual hfac-dihydrate from condensing. The pump is either self-heated from its operation, or a heater 24 is provided to maintain the pump at the desired temperature. Some pumps run at temperatures as hot as 105° C., which is sufficient to keep $Cu^{2+}$ (hfac)$_2$ in the vapor phase. The foreline 20 may be heated by heating tape 26, for example, in either a temperature-controlled fashion or in an open-loop fashion.

A cold trap 28 attached to the output of the pump 22 freezes $Cu^{2+}$ (hfac)$_2$ and condenses hfac-dihydrate (the "hfac components") from the exhaust stream. The hfac-dihydrate, also known as Hhfac, has a boiling point around 70° C. Placing the cold trap after the pump output, which is near atmospheric pressure, allows the cold trap to be much smaller than if it were placed in the foreline. This is because the efficiency of the cold trap depends on the number of collisions that occur between gas molecules and the walls of the cold trap. The number of these collisions is roughly proportional to the operating pressure, and the foreline may be operating at about 400 mT, or about $\frac{1}{1000}$th atmospheric pressure. Thus, placing the cold trap after the pump allows a more compact design. The cold trap 28 is placed close to the pump 22 so that most of the hfac components freeze or condense out in the cold trap, and not in the conduit between the pump and the cold trap. In this configuration, the cold trap may be placed in the pump alley of a fabrication facility. It is highly desirable to recycle the hfac components because hfac is difficult to manufacture and expensive. Therefore, the cold trap may be sealed and sent to a precursor manufacturer so that the precursor manufacturer may recover the hfac components. A burn box 30 and wet scrubber 32 complete the waste abatement system.

Figure 2:
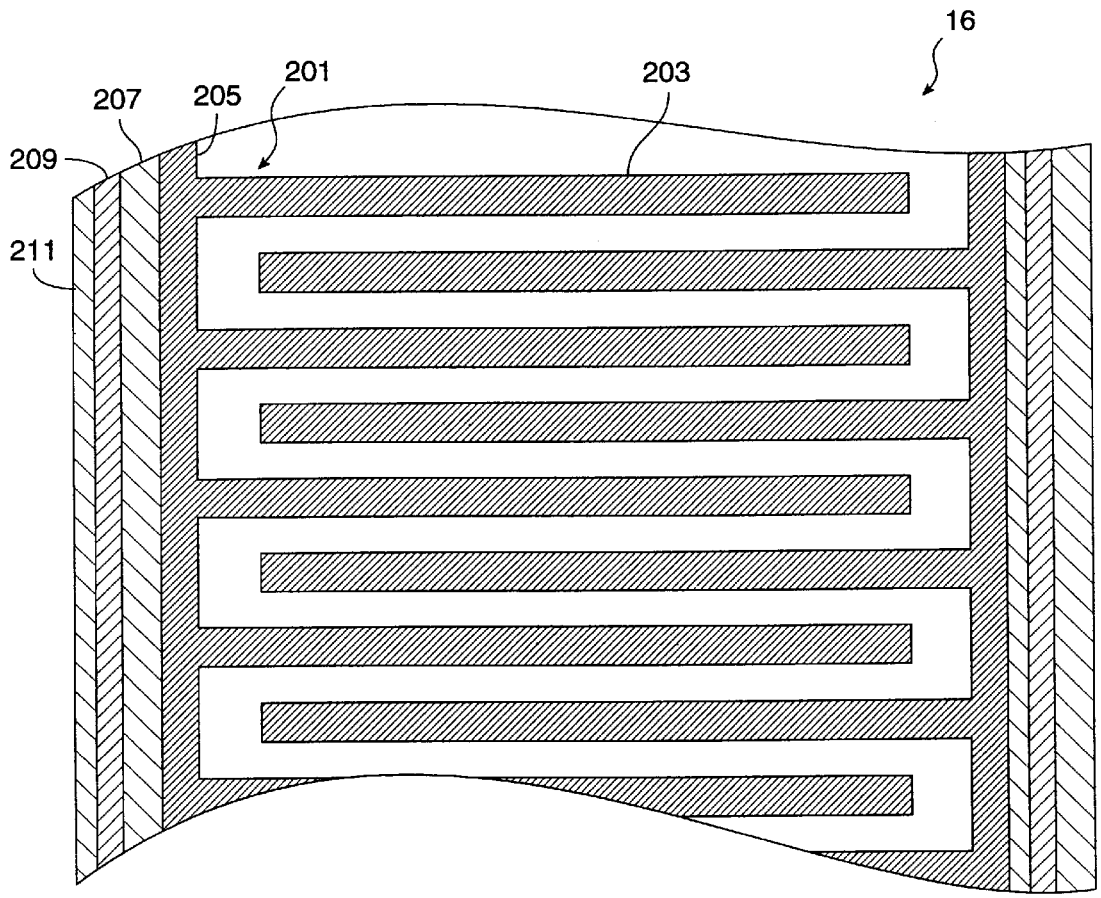
FIG. 2 is a simplified cross section of a portion of a hot trap according to one embodiment of the present invention.

FIG. 2 is a simplified cross section of a portion of a hot trap 16. The hot trap includes a baffle assembly 201 that consists of a series of baffles, or plates, 203 approximately 4"×5"×0.25" joined to a thermal buss bar 205. The baffles are spaced approximately 1" apart on the buss bars. The spacing provides sufficient fluid conductance as to not unduly reduce the pumping capacity of the CVD system. Deposition systems typically have some amount of additional pumping capacity, that is, the vacuum pump provides sufficient exhaust flow and chamber pressure for the desired CVD process below the pump's maximum rated output. Therefore, the pump can still reach the desired operating point if the resistance of the exhaust line is increased slightly by the hot trap.

The hot trap has four buss bar assemblies, two each on opposite sides of the hot trap, but could have more or fewer assemblies. Segmenting the baffles in the hot trap into sections allows baffles closer to the inlet of the hot trap, which may have a greater thickness of copper built up, to be removed and replaced, while leaving the downstream baffles in place, thus reducing maintenance time and expense. Even though the downstream baffles may not have sufficient copper built-up on them to justify their removal and replacement, the downstream baffles are important for removing additional precursor from the exhaust stream. Furthermore, the downstream baffles can have a different configuration, such as a different height, than the upstream baffles, as can baffles within a baffle assembly. For example, a baffle assembly can have baffles of varying height, or some or all of the baffles could be textured or perforated to increase the surface area of the baffle.

The baffle assemblies are made of copper because of copper's excellent thermal conductivity and because the unreacted precursor in the exhaust stream readily reacts on a copper surface. Furthermore, by making the baffle assemblies out of copper, and plating pure copper onto the baffles, the copper is easily recovered for recycling. However, it is not necessary to make the baffle assembly out of copper.

The baffles are heated to above 200° C., preferably about 250–260° C., to promote the conversion and recovery of the precursor. While many means may accomplish this, the baffle assembly 201 is clamped with bolts (not shown) to a heated wall 207 of the hot trap shell 211. An electric resistance heater 209 heats the shell, which heats the baffle assembly 201. The heated wall is made of stainless steel, such as 316 or 304 series stainless steels, which have thermal expansion coefficients similar to copper. The heated wall could be made of copper, but stainless steel is easier to machine and weld, and is less likely to absorb impurities than copper.

Figure 3:
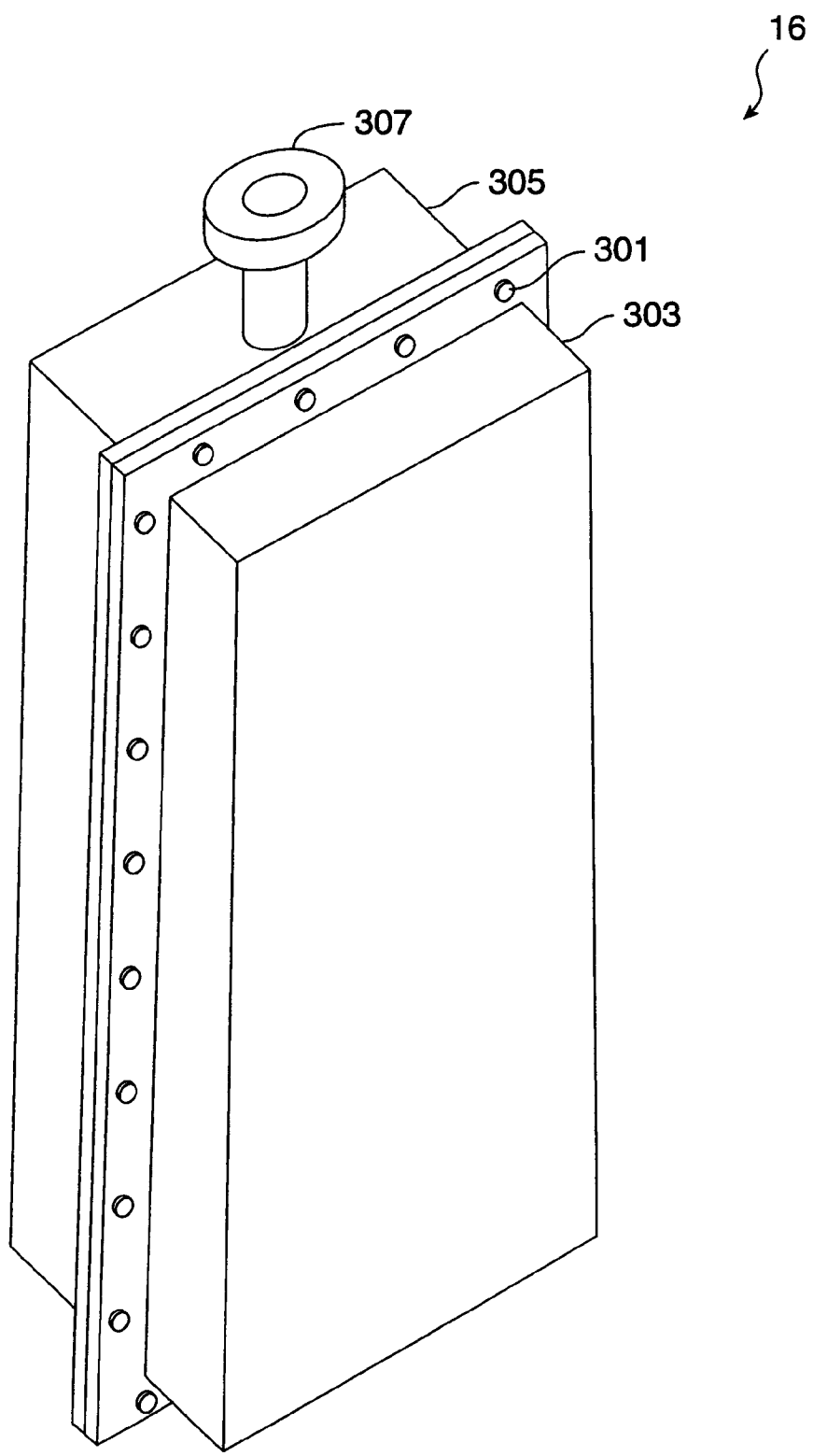
FIG. 3 is a simplified isometric view of one embodiment of a hot trap according to the present invention.

FIG. 3 is a simplified isometric view of a hot trap 16 in a "clamshell" configuration. Bolts 301 hold the two halves 303, 305 of the clamshell together against a copper gasket (not shown). When the hot trap is evacuated, atmospheric pressure will force the shell haves together to deform the copper gasket and create what is known as a copper-metal seal. The effluent stream flows into the inlet 307 and out the outlet (not shown), which are both located on one half 305 of the clamshell. The clamshell configuration provides ready access for removal and replacement of the baffles without disrupting the vacuum lines that are connected to the inlet and outlet of the hot trap.

Figure 4:
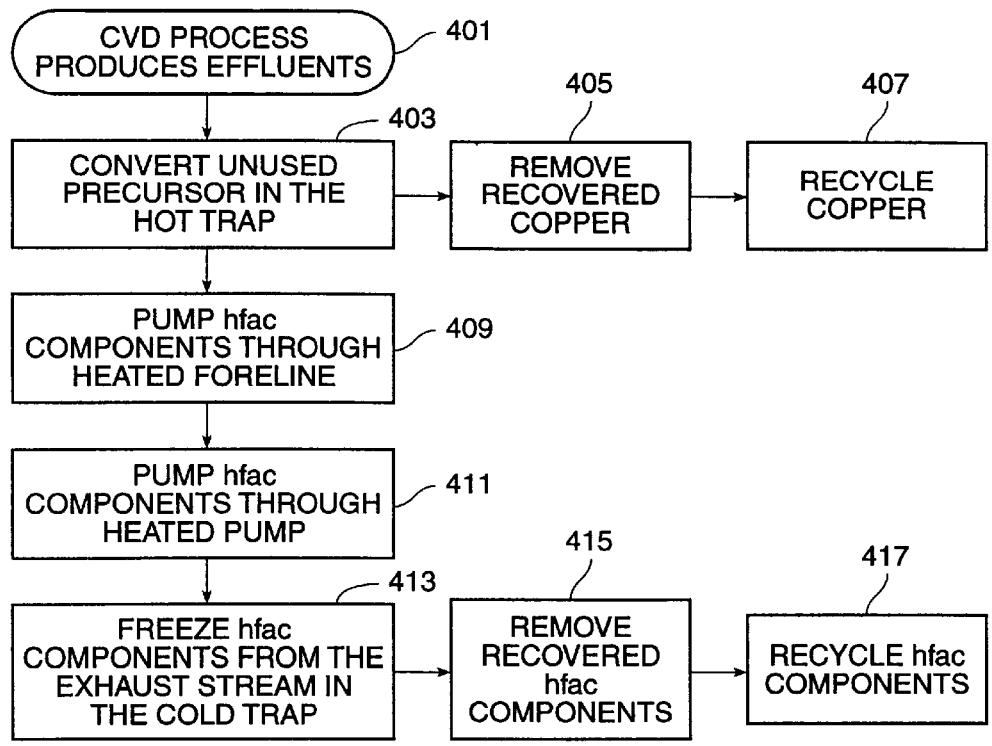
FIG. 4 is a simplified flow chart of a process for removing effluents from an exhaust stream according to one embodiment of the present invention.

FIG. 4 is a simplified flow chart of a method for the abatement and recovery of effluents from a copper CVD process. An effluent stream is produced by a process chamber (step 401). Unused precursor in the effluent stream is reacted in a hot trap to recover metallic copper (step 403). The metallic copper may be optionally removed (step 405) and recycled (step 407). The exhaust stream is pumped through a heated foreline (step 409) and a heated pump (step 411) to a cold trap. The cold trap freezes the $Cu^{2+}$ $(hfac)_2$ (step 413), which may be optionally removed (step 415) and recycled (step 417).

Figure 5:
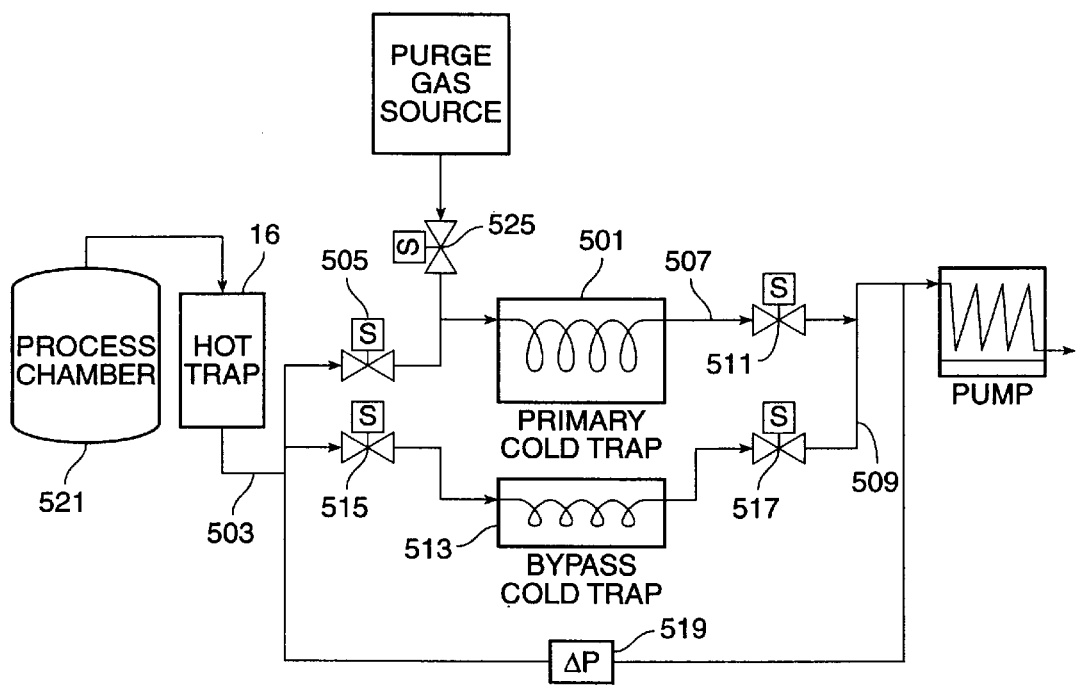
FIG. 5 is a simplified block diagram of a CVD and abatement system according to another embodiment of the present invention.

FIG. 5 is a simplified block diagram of an abatement-recovery system for use with a copper CVD system that incorporates a cold trap following the hot trap. This configuration places a cold trap close enough to the hot trap to avoid having to heat the foreline to prevent freezing of the $Cu^{2+}$ $(hfac)_2$, as in the system shown in FIG. 1; however, it will typically place the cold trap in the clean room of a fabrication facility, rather than in the pump alley. Clean room area is very expensive to build and maintain, perhaps an order of magnitude more expensive than pump alley area. Therefore, it is important that any cold trap placed in the clean room be efficient and compact. It is also important that the cold trap not act as a particle source, either during processing or when the cold trap is serviced, and that any maintenance or service of the cold trap affects the production capacity of the CVD system as little as possible.

A bypass cold trap arranged in parallel with a primary cold trap allows either cold trap to be removed and replaced, for maintenance or other purposes, without unduly disrupting the product flow through the processing chamber. A similar arrangement of parallel hot traps may also be used for the purpose of removing the hot trap without unduly disrupting production.

The primary cold trap 501 is connected to an outlet 503 of the hot trap 16 through a primary inlet valve 505. A primary outlet 507 of the primary cold trap 501 is connected to a foreline 509 through a primary outlet valve 511. The bypass cold trap 513 is also connected to the outlet 503 of the hot trap 16 through a bypass inlet valve 515, and to the foreline 509 through a bypass outlet valve 517.

During normal operation, the primary inlet valve 505 and the primary outlet valve 511 of the primary cold trap are open, while the bypass inlet valve 515 and bypass outlet valve 517 are closed. This routes the output of the hot trap 16 through the primary cold trap 501. The resistance to flow through the primary cold trap is determined by measuring the pressure drop across it during operation. A differential pressure sensor 519 measures the pressure difference between the outlet of the hot trap 503 and the foreline 509. As the primary cold trap becomes constricted with frozen byproducts of the CVD reaction, the pressure differential will rise. When the pressure differential exceeds a selected limit, it is time to remove and replace the primary cold trap. Alternatively, the power load of the pump could be monitored to determine when the flow resistance of the primary cold trap indicates that it is constricted with frozen byproducts, or a series of pressure sensors could be placed at appropriate locations in the system to derive the desired pressure differential information. The effluent path is generally not switched during a CVD wafer deposition process, but is switched after a wafer deposition process has finished and before the next has started.

The first step in removing and replacing the primary cold trap is, after completion of a CVD process, to close the primary inlet valve 505. A purge valve 525 is then opened to provide purge gas, such as nitrogen, from a purge gas source 527 to the primary cold trap for approximately 30 seconds. The purge gas flow is considerably higher than the normal process exhaust flow, up to the capacity of the vacuum pump, and carries loosely-bound particles out the exhaust stream so that they won't escape into the clean room or create a safety hazard for personnel.

After purging, the purge valve 525 and primary outlet valve 505 are closed. The bypass inlet valve 515 and bypass outlet valve 517 are opened, and the next CVD process may begin. The primary cold trap is then removed from the CVD system and replaced with a new or refurbished primary cold trap. The used primary cold trap is sealed to contain the valuable and hazardous hfac-components by attaching a closed flange (not shown) to the inlet and outlet of the cold trap, and is returned to the precursor manufacturer or other recycling facility.

The bypass cold trap 513 is designed to be more compact and efficient, at the cost of increased flow restriction, than the primary cold trap 501, but the two cold traps could be very similar or even identical. Either or both of the cold traps may be implemented in a similar fashion to the hot trap described above in conjunction with FIGS. 2 and 3. However, it is not as important to make the baffle assemblies out of copper. In this system, the effluents that are intended to be trapped freeze or condense at above room temperature, so the cold trap may not require any active cooling, depending on the ambient temperature and mass flow through the cold trap. If necessary, chilled liquid or other cooling medium could be provided to the cold trap shell. Alternatively, either or both cold traps could be implemented as a serpentine coil of foreline tubing surrounded by a cooling jacket. The temperature of the fluid inside the cooling jacket could be selected to determine the rate of freezing to more evenly distribute the frozen hfac-components throughout the tubing.

Figure 6:
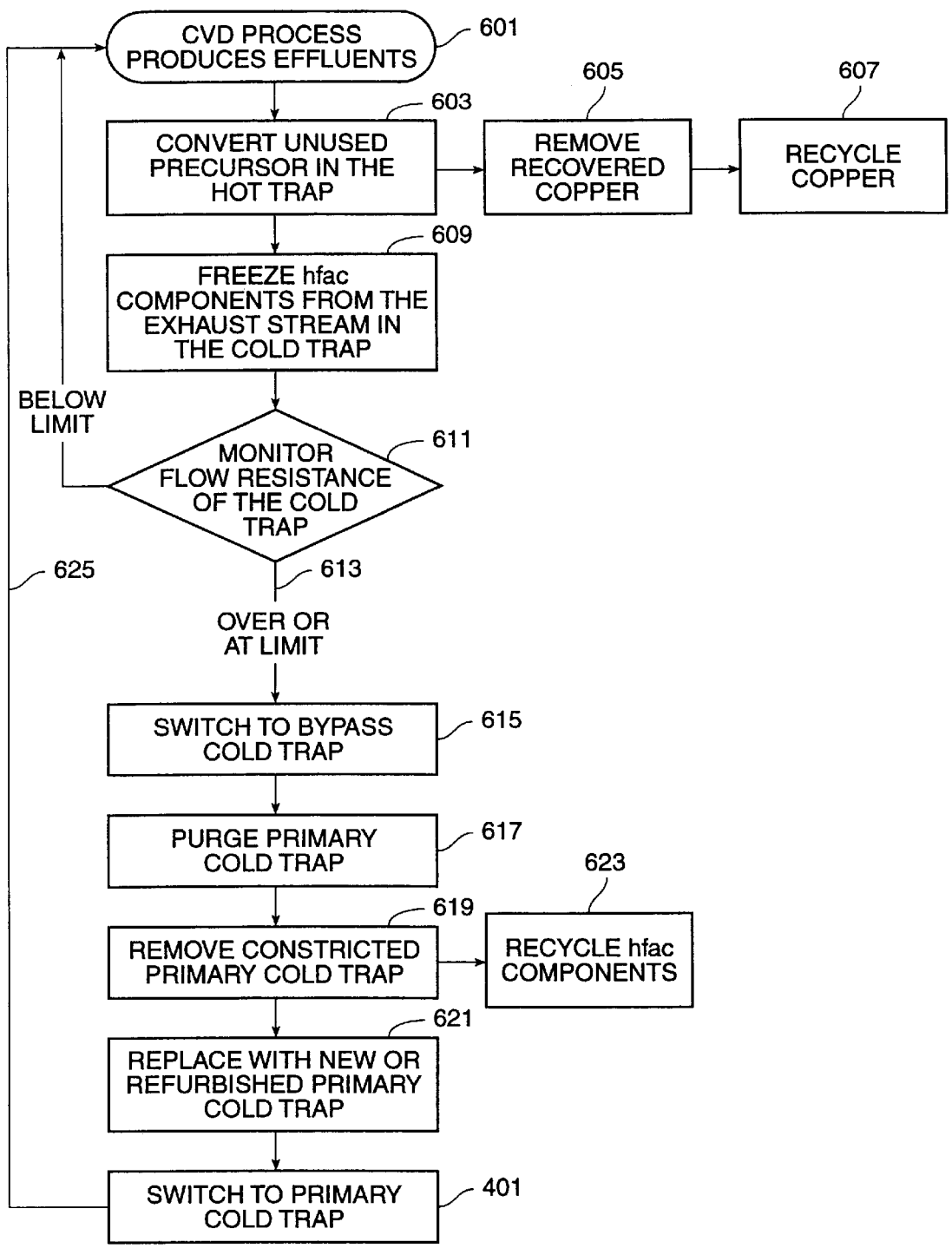
FIG. 6 is a simplified flow chart of a process for removing effluents from an exhaust stream according to another embodiment of the present invention.

FIG. 6 is a simplified flow chart of a method for the abatement and recovery of effluents from a copper CVD process. An effluent stream is produced by a process chamber (step 601). Unused precursor in the effluent stream is reacted in a 10 hot trap to recover metallic copper (step 603). The metallic copper may be optionally removed (step 605) and recycled (step 607). The heated effluent stream flows into a cold trap that freezes the $Cu^{2+}$ $(hfac)_2$ out of the effluent stream onto the walls of the cold trap (step 609). A flow resistance of the cold trap is monitored (step 611) and if the flow resistance exceeds a selected limit (step 613), the effluent stream is switched from the primary cold trap to the bypass cold trap (step 615). The primary cold trap is then purged (step 617), removed (step 619) and replaced (step 621). The removed primary cold trap may optionally be sent to out to recover and recycle the hfac components (step 623). After replacing the cold trap (step 621), the effluent stream is switched from the bypass cold trap to the primary cold trap (step 625).

While the above is a complete description of specific embodiments of the present invention, various modifications, variations, and alternatives may be employed. For example, nitrogen ballast could be injected into the exhaust stream to further limit effluent or particle backstreaming, or the hot trap could be a coil of heated copper tubing, or a grid of ohmically heated copper wire or wire mesh placed transversely in the foreline. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. An apparatus for converting unreacted metal-film precursor in an effluent stream from a chemical vapor deposition process, the apparatus comprising:
   a hot trap coupled to a process chamber with a conduit, the hot trap receiving the effluent stream from the process chamber through the conduit, the hot trap including a heater and a plurality of removable baffles, said heater operatively coupled to said removable baffles; and
   a vacuum pump fluidly coupled to the process chamber downstream of the hot trap, the vacuum pump capable of providing a pressure differential between an interior of the process chamber and an exhaust port of the process chamber.

2. The apparatus of claim 1 further including a cold trap fluidly coupled to the process chamber downstream of the hot trap.

3. The apparatus of claim 2 wherein the vacuum pump is disposed between the hot trap and the cold trap.

4. The apparatus of claim 2 wherein the cold trap is disposed between the hot trap and the vacuum pump.

5. The apparatus of claim 1 wherein the removable baffles are metal.

6. The apparatus of claim 5 wherein the removable baffles comprise copper.

7. The apparatus of claim 1 wherein said heater is adapted to heat said baffles to a temperature above 200° C.

8. An apparatus for collecting metal from an effluent stream of a substrate processing chamber, said apparatus comprising:
   a first trap fluidly coupled to receive the effluent stream from the substrate processing chamber, said first trap including a first interior surface and a heater operatively coupled to heat said first interior surface;
   a vacuum pump, operatively coupled to said substrate processing chamber on the downstream side of said first trap; and
   a second trap fluidly coupled to said substrate processing chamber downstream of said first trap, said second trap including a second interior surface, wherein said second trap is adapted to freeze an emission product on said second interior surface.

9. The apparatus of claim 8 wherein said second trap is positioned downstream from said vacuum pump.

10. The apparatus of claim 8 wherein said second trap is positioned between said first trap and said vacuum pump.

11. The apparatus of claim 8 wherein said first trap includes a plurality of removable baffles with each of said baffles being operatively coupled to said heater and wherein said first surface is a surface of one of said removable baffles.

12. The apparatus of claim 11 further comprising:
   a third trap fluidly coupled to the process chamber downstream of said first trap and in parallel with said second trap, said third trap including a third interior surface, wherein said third trap is adapted to freeze the emission product on said third interior surface;
   gas valves operatively coupled to said second and third traps so that the effluent stream from said processing chamber can be directed through either said second or third trap; and
   a purge valve, operatively coupled to at least said second trap, that can be opened to flow a purge gas through said second trap.

13. The apparatus of claim 12 wherein said third trap is smaller than said second trap and provides increased flow restriction as compared to said second trap.

14. The apparatus of claim 8 wherein said heater is adapted to heat said first interior surface to a temperature above 200° C.

15. A substrate processing system comprising:
   a substrate processing chamber having an exhaust outlet;
   a hot trap fluidly coupled to said exhaust outlet, said hot trap including first and second opposing sections that can be fixedly attached to form an enclosed chamber having an inlet, an outlet and a collection chamber therebetween, said collection chamber including a first plurality of baffles that can be removably attached to said first section so that, when said first and second opposing sections are fixedly attached to form said enclosed chamber, said first plurality of baffles extend toward said second section, said hot trap further including a heater operatively coupled to heat said first plurality of baffles; and a vacuum pump operatively coupled to said substrate processing chamber downstream of said hot trap;

wherein said first and second sections of said hot trap can be separated to facilitate cleaning of said hot trap.

16. The substrate processing system of claim 15 wherein said collection chamber further includes a second plurality of baffles that can be removably attached to said second section so that, when said first and second opposing sections are fixedly attached to form said enclosed chamber, said second plurality of baffles extend toward said first section, wherein said heater is operatively coupled to heat said second plurality of baffles.

17. The substrate processing system of claim 16 wherein said first and second plurality of baffles are interdigitated and form a serpenting passageway within said collection chamber when said first and section sections are fixedly attached.

18. The substrate processing system of claim 15 further comprising a cold trap fluidly coupled to said substrate processing system downstream of said vacuum pump.

* * * * *